United States Patent

Bosselmann

[11] Patent Number: 6,140,634
[45] Date of Patent: Oct. 31, 2000

[54] SENSOR FOR MEASURING ELECTRICAL CURRENT STRENGTH AND/OR VOLTAGE

[75] Inventor: Thomas Bosselmann, Erlangen, Germany

[73] Assignee: Siemens Aktiengesellschaft, Munich, Germany

[21] Appl. No.: 09/254,943
[22] PCT Filed: Jul. 10, 1997
[86] PCT No.: PCT/DE97/01459
 § 371 Date: Mar. 19, 1999
 § 102(e) Date: Mar. 19, 1999
[87] PCT Pub. No.: WO98/12565
 PCT Pub. Date: Mar. 26, 1998

[30] Foreign Application Priority Data

Sep. 19, 1996 [DE] Germany ............... 196 38 456

[51] Int. Cl.⁷ ................................. H01J 40/14
[52] U.S. Cl. ......................... 250/225; 250/227.24
[58] Field of Search ..................... 250/225, 227.24, 250/227.19, 227.27

[56] References Cited

U.S. PATENT DOCUMENTS 6,043,648 3/2000 Menke et al. ..................... 250/225

FOREIGN PATENT DOCUMENTS 0 390 581 10/1990 European Pat. Off. .
32 02 089 8/1983 Germany .
43 12 183 10/1994 Germany .

OTHER PUBLICATIONS

Laming et al. "Electric Current Sensors Employing Spun Highly Birefringent Optical Fibers", *Journal of Lightwave Technology*, vol. 7, No. 12, Dec. 1989, pp. 2084–2094.

Primary Examiner—Hung Xuan Dang
Attorney, Agent, or Firm—Hill & Simpson

[57] ABSTRACT

Sensor for measuring the electrical current strength and/or voltage. Magneto-optical sensor (1) for measuring the current strength (I), with the aid of the temperature-dependent Verdet constant (V), of a fiber coil (3) arranged in the electromagnetic field (F) produced by the electrical current (i), whereby the temperature-dependent decay time ($\Delta t$) of the fluorescence of a fluorescing material (6) arranged in the vicinity of the coil is measured, the temperature (T) associated therewith of the coil is determined, and the value ($V_{eff}$) belonging to this temperature, of the Verdet constant (V) is determined, with which the current strength is to be determined. Application in current and voltage sensors.

17 Claims, 1 Drawing Sheet

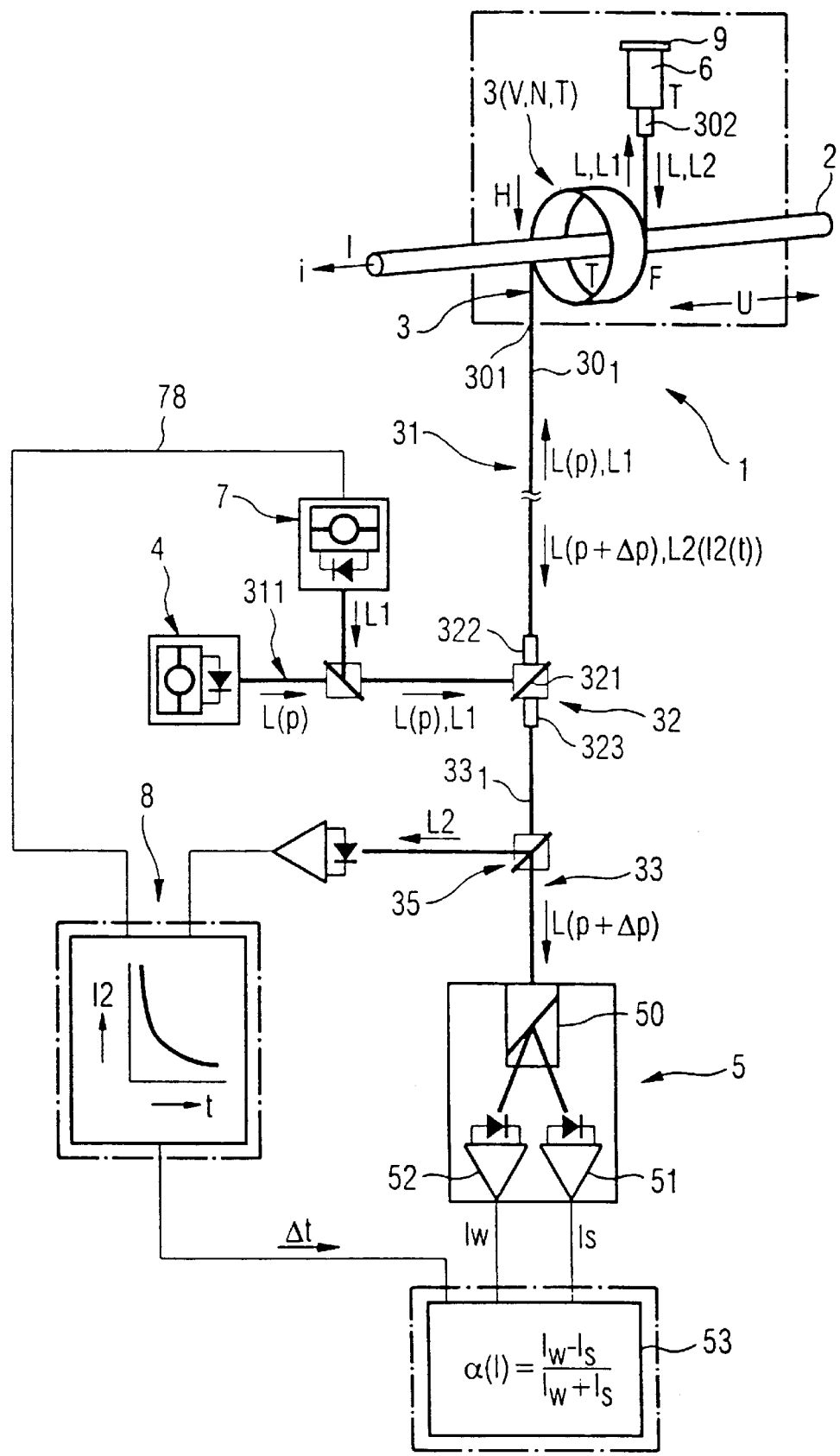

SENSOR FOR MEASURING ELECTRICAL CURRENT STRENGTH AND/OR VOLTAGE

BACKGROUND OF THE INVENTION

The invention relates to a sensor for measuring electrical properties selected from a group consisting of current strength and voltage. The sensor includes a source of testing light with a particular parameter; an optical transparent medium being arranged in an electrical field, which surrounds a conductor and is produced by the electricity flowing in the conductor, the testing light being sent through the medium to experience a change in the parameter that is determined by defined optical material constants of the medium, which constants depend on the temperature of the medium and the particular field strength of the electromagnetic field; an evaluation means to obtain a quantity of the modifications of the parameter of the testing light passing through the medium so that the current strength can be determined with the aid of the quantity and the material constant.

Sensors of the named type are known and are of interest for energy measurement tasks. Sensors of this type are mostly used for measuring current strength and/or voltage of alternating current.

A problem in sensors of this type is the material constant of the optically transparent medium intended for the measurement, which constant is dependent on the temperature of this medium, by means of which constant a required measurement precision cannot be achieved.

In order to take into account this material-specific temperature dependence, it is known to arrange an external conventional temperature sensor on the medium intended for the measurement, which sensor measures the temperature of this medium immediately. The electrical current strength to be measured can then be determined with the material constant allocated to this measured temperature.

SUMMARY OF THE INVENTION

The invention is based on the object of providing a sensor of the type named above in which the temperature dependence of the material constant can be taken into account without an external temperature sensor.

This object is achieved by an improvement in the sensor. The improvement comprises a fluorescing medium being arranged close to the optical transparent medium so as to be at the same temperature as the medium, said fluorescing medium emitting a fluorescent light when excited by an exciting light, said fluorescent light having an intensity decaying after termination of the exciting light with the decay time being dependent on the temperature of the fluorescing medium, a source of exciting light; means for radiating the exciting light onto the fluorescing medium; and fluorescent light evaluation means for determining the decay time of the fluorescent light to obtain the temperature and Verdet constant which are used to determine the electrical current strength in the conductor.

According to the invention, the particular material constant belonging to a particular temperature of the optically transparent medium and that is to be used for the determination of the current strength and/or voltage is determined by determining the decay time of the fluorescent light produced in the fluorescing material by the intensity-modulated exciting light.

The inventive sensor is suited in particular for optically transparent media in which no additional temperature-dependent effect occurs, other than the temperature dependence of the optical material constant of this medium. This also holds in particular for a magneto-optical sensor in which measurement takes place in the optically transparent medium with the aid of the Faraday effect, and the optical material constant of this medium is the Verdet constant.

Further temperature-dependent effects are for example linear and circular birefringence effects in the optically transparent medium that change with the temperature and that obscure the material-specific temperature dependence of the material constant by means of superposition.

It is useful to arrange the fluorescing material used in the inventive sensor in a light path of the light under test produced by the source of the light under test, said path leading from the source of the light under test through the determined medium, and to couple the exciting light produced by the exciting light source into the light path of the light under test, and to supply it to the fluorescing material on this light path. This simplifies the construction of the inventive sensor.

An optically transparent medium, comprising a temperature-dependent material constant, in the form of a coil in a reflection arrangement, said coil consisting either of a highly twisted LoBi fiber, wherein LoBi LoBi stands for low birefringence, or of a spun HiBi fiber, wherein spun HiBi stands for spun high birefringence which equal spun and highly birefringent, is particularly suited for an inventive magneto-optical sensor. In this coil no measurable modification of the intrinsic birefringence with temperature takes place, because an existing intrinsic linear birefringence is compensated by means of an induced circular birefringence. The reflection arrangement thereby has the effect that a temperature dependence of this linear birefringence is immediately compensated.

A sensor having the fluorescing medium arranged in the light path of the testing light and the exciting light after passing through the medium comprising the features of, a reflector being arranged in the light path of the testing light leaving the medium to reflect the testing light back through the medium to then be coupled out to the testing light evaluation means and the fluorescing material being arranged between the medium and reflector. This device is an inventive sensor suitable for an optically transparent medium in the form of a fiber in a reflection arrangement.

The requirements on the temperature measurement are advantageously relatively low in the inventive sensor; a precision of a maximum of 1° C. is sufficient.

It is hereby noted that the invention is not limited to magneto-optical sensors, but rather can also be applied in electro-optical sensors, e.g., sensors in which measurement takes place in the optically transparent medium with the aid of the Pockels effect.

Other advantages and features of the invention will be readily apparent from the following description of the preferred embodiments, the drawings and claims.

BRIEF DESCRIPTION OF THE DRAWINGS

The FIGURE is a schematic diagram of the sensor of the invention.

DESCRIPTION OF THE PREFERRED EMBODIMENTS

The FIGURE shows, in a schematic representation, an example of an inventive sensor, generally designated 1.

The exemplary sensor 1 is a known magneto-optical sensor for measuring the current strength I of an electrical current i conducted in an electrical conductor 2 on the basis of the Faraday effect.

The sensor 1 is made of the optically transparent medium 3 intended for the measurement, in the form of a coil surrounding the conductor 2 in a number N of windings, made of a highly twisted LoBi fiber or spun HiBi fiber 30 made of glass.

The material constant of the glass material of the fiber 30, which is decisive for the Faraday effect, of the coil 3 is the Verdet constant V, which is dependent on the temperature T of the coil 3.

The coil 3 is arranged in the electromagnetic field F, which field is produced by the current i flowing in the electrical conductor 2, and surrounds this conductor 2.

Light under test or testing light L of a particular linear polarization p is sent through the fiber 30 of the coil 3. During the passage through the fiber 30 of the coil 3, the linear polarization p experiences a change of polarization $\Delta p$ in the form of a rotation of the polarization plane of the linear polarization p by a certain angle of rotation $\Delta \phi$, which depends on the Verdet constant V of the material of the fiber 30 of this coil 3, which constant depends on the temperature T of the coil 3. The angle also depends on the field strength H of the electromagnetic field F produced by the current i, and, in addition, depends on the length of the fiber 30, of the coil 3; which is located in the electromagnetic field F, for example on the number N of the windings of the coil 3.

The light under test L of the particular linear polarization p is produced by means of a source 4 of the light under test, which is for example a laser diode.

The light under test L produced by the source 4 of the light under test is supplied to one end 301 of the fiber 30 of the coil 3 on a light path 31. A component of the light path 31 is for example an optical fiber $30_1$ coupled optically to this one end 301 of the fiber 30 of the coil 3, which fiber $30_1$ can for example be the same fiber as the fiber 30 of the coil 3, and can form one piece with this fiber 30.

A reflector 9 is arranged opposite the other end 302 of the fiber 30 of the fiber coil 3, from which other end the light under test L, coupled into the coil 3 via the one end 301, is coupled out of the coil 3 after passage through the coil 3 in the direction from the one end 301 to the other end 302. This reflector 9 reflects the light under test L coupled out from the other end 302 back to the other end 302, so that the back-reflected light under test L is again coupled into the fiber 30 of the coil 3 at this other end 302, and passes through the coil 3 in the opposite direction from the other end 302 to the one end 301. From the one end 301, the back-reflected light under test L again travels on the light path 31, in which it is propagated in the direction opposite to the supplied light under test L.

The reflector 9 realizes a reflection arrangement coil 3, in which a linear birefringence that arises in the fiber 30 of the coil 3, independent of the Faraday effect, advantageously compensated by means of an induced circular birefringence, whereas in contrast the change of polarization $\Delta p$ of the linear polarization p of the light under test L, which change of polarization is caused by the Faraday effect, is equal to twice the change of a single passage through the coil 3, due to the double passage of the light under test L through the coil 3.

The back-reflected light under test L, again traveling on the light path 31, with the linear polarization p+$\Delta p$ (modified by $\Delta p$) is coupled out from this light path 31 at a coupler 32 arranged in the light path 31 and is supplied to an evaluation means 5 for the light under test. The coupler 32 must be non-polarizing. This means that the coupler 32 may not essentially modify the polarization p or, respectively, p+$\Delta p$ of the supplied and back-reflected light under test or testing light L. For example the coupler may modify this polarization at most by a predetermined permissible slight deviation.

The coupler 32 can for example comprise a non-polarizing beam divider or fiber coupler.

In the exemplary sensor 1, the coupler 32 consists for example of a beam divider 321 arranged between two optical lenses 322 and 323, to which divider the light under test L produced by the source 4 of the light under test is supplied on a segment 311 of the light path 31. The beam divider 321 diverts the light under test L to the lens 322, whereby a portion of the light under test L that has passed through the beam divider 321 is not used for current measurement. The lens 322 couples the diverted light under test L into the fiber $30_1$.

The back-reflected light under test L, again traveling on the light path 31, is supplied to the lens 323 through the lens 322 and the beam divider 321, which lens 323 couples this light under test L for example into an optical fiber $33_1$, which is a component of a light path 33 on which the light under test L is supplied to the evaluation means 5 for the light under test by the coupler 32 for evaluation. A portion of the back-reflected light under test L deflected by the beam divider 321 is not evaluated.

The lenses 322 and 323 are preferably gradient lenses.

In the evaluation means 5 for the light under test, a quantity $\alpha$ is obtained that corresponds to the change of polarization $\Delta p$ that the light under test L, which has passed twice through the coil 3, has experienced. With the aid of this quantity $\alpha$ and the Verdet constant V, the current strength I of the current i in the conductor 2 can be determined, together with the length of the fiber 30, given for example by the number N of windings.

The evaluation means 5 for the light under test can for example comprise a polarization beam divider 50, e.g. in the form of a Wollaston prism, in which the modification of polarization $\Delta p$ of the linear polarization p is analyzed. The optical power $I_s$ of a particular fixed component $p_s$ of the supplied linear polarization p+$\Delta p$ and the optical power $I_w$ of a component $P_w$, perpendicular to this component $p_s$, of this polarization p+$\Delta p$ exits from the prism 50. These optical powers $I_s$ and $I_w$ are transformed, e.g. by means of opto-electrical transducers 51 or, respectively, 52 of the evaluation means 5 for the light under test, into electrical signals, e.g. voltages, which are further processed by an electrical evaluation unit 53, consisting for example of a digital signal processor, of the evaluation means 5 for the light under test to form the quantity $\alpha$, for example $\alpha=(I_w-I_s)/(I_w+I_s)$.

According to the invention, in order to take into account the temperature dependence of the Verdet constant V, a fluorescing material 6 is arranged so close to the coil 3 that it always comprises essentially the same temperature T as the coil 3, whereby an emission of fluorescent light L2 can be excited in the fluorescing material 6 by means of the irradiation of exciting light L1, whose intensity I2 decays with a particular decay time $\Delta t$ after termination of an irradiation of exciting light L1, whereby the fluorescing material 6 is selected so that the decay time $\Delta t$ depends in a defined manner on the temperature T of the fluorescing material 6.

Some fluorescing materials display this characteristic of a temperature-dependent decay time, which in addition decays exponentially given excitation with pulsed exciting light (see Th. Bosselmann, A. Reule, J. Schröder: "Fiber-optic temperature sensor using fluorescence decay time", Proc. 2nd Conf. OFS 84, Stuttgard, Proc. SPIE Vol. 514, 1984, pages 151 to 154).

For the determination of the decay time Δt of the fluorescent light L2 excited in the fluorescing material 6, intensity-modulated exciting light L1 is irradiated into this material 6, produced by an exciting light source 7 that can be modulated, comprising for example a laser diode.

The excited fluorescent light L2 is supplied to a fluorescent light evaluation means 8 in order to determine the decay time Δt of the fluorescent light L2 excited by means of the intensity-modulated exciting light L1. From the determined decay time Δt, the temperature T, belonging to this determined decay time Δt, of the fluorescing material 6, and the value Veff, belonging to this temperature T, of the Verdet constant V is to be determined, with which the electrical current strength I is to be determined.

The fluorescent light evaluation means 8 comprises for example an opto-electrical transducer 81 for the conversion of the intensity I2 of the fluorescent light L2 into a corresponding electrical intensity signal, and an evaluation unit 82 in which the decay time Δt of the fluorescent light L2 is determined from the electrical intensity signal that decays corresponding to the optical intensity I2.

Corresponding to various evaluation methods (see the above named Proc. 2nd Conf. OFS 84, Stuttgard, Proc. SPIE Vol. 514, 1984, pages 151 to 154), there are various modulation possibilities corresponding to which the exciting light L1 is to be modulated, for example pulse modulation, square wave modulation, sinusoidal modulation. A particularly simple evaluation method uses pulsed modulation, in which the exciting light L1 consists of successive pulses and the fluorescence is cyclically excited, measures the decaying intensity I2 of the fluorescent light L2 over time t, and determines the decay time Δt. From the particular decay time Δt, the temperature T, associated with this particular duration Δt, of the fluorescing material 6 can be determined, for example by means of a value table. From the determined temperature T, the value $V_{eff}$, belonging to this temperature T, of the Verdet constant V can be calculated, with which value the current strength I can be calculated by means of $$I=\alpha/(N \cdot V_{eff}),$$

for example in the signal processor 53.

The chronological matching between the exciting light source 7 and the fluorescent light evaluation means 8 can take place via a trigger and feedback line 78 that connects this source 7 and this means 8.

In the exemplary sensor 1, the fluorescing material 6 is arranged in the light path 31 of the light under test L leading from the source 4 of the light under test through the coil 3, and the exciting light L1 produced by the exciting light source 7 is coupled into the light path 31 of the light under test L and is supplied to the fluorescing material 6 on this light path 31, whereby it is advantageous for the fluorescing material 6 to be arranged between the coil 3 and the reflector 9.

For example, the exciting light L1 is coupled into the light path 31 by means of an optical coupler 34, for example a beam divider, arranged in the segment 311 between the source 4 of the light under test and the coupler 32 of the light path 31 of the light under test L. For the polarization of the light under test L produced by the light source 4, this coupler 34 must be non-polarizing.

The fluorescent light L2 produced by the fluorescing material 6 is conducted through the coil 3 on the light path 31 of the light under test L, i.e., on the fiber 30, and, after passing through the coil 3, is coupled out of the light path 31 of the light under test L and into the fluorescent light evaluation means 8.

For this purpose, a separation of the fluorescent light L2 from the light under test L is required. Since, as a rule, the wavelength λ2 of the fluorescent light L2 is different from the wavelength λ of the light under test L, this can take place by means of a wavelength demultiplexer 35, which can be arranged for example in the light path 33 leading from the coupler 32 to the evaluation means 5 for the light under test, and which couples only the fluorescent light L2 out of the light path 33 and supplies it to the fluorescent light evaluation means 8. This demultiplexer 35 must not essentially modify the polarization of the light under test supplied to the evaluation means 5 for the light under test.

The coupler 32 must be wavelength-independent for a wavelength region comprising the wavelength λ2 of the fluorescent light L2 and the wavelength λ of the light under test L. Since, as a rule, the wavelength λ1 of the exciting light L1 is also different from the wavelength λ of the light under test L, the coupler 34 and the coupler 32 should be wavelength-independent for a wavelength region comprising the wavelength λ1 of the exciting light L1 and the wavelength λ of the light under test L.

The intensity I1 and wavelength λ1 of the exciting light L1 are usefully selected so that the exciting light L1 is absorbed completely by the fluorescing material 6, so that no more exciting light L1 comes from this material 6. If this is not the case, then in the exemplary sensor 1 a measure must be provided for the separation of the exciting light L1 from the light under test L and the fluorescence light L2, which can for example be a wavelength-selective optical filter means, if the wavelength λ1 of the exciting light L1 is different both from the wavelength λ of the light under test L and also from the wavelength λ2 of the fluorescent light L2, which is normally the case.

The fluorescing material 6 can be present in the form of a crystal. Crystals are mainly used that are doped with ions of the rare earths, such as neodymium, erbium, terbium, or the transition metals such as chromium or manganese (see Journ. of Lightw. Techn., Vol. 7, No. 12, December/1989, pages 2084 to 2095).

In the exemplary sensor 1, in this case the light under test L and exciting light L1 are usefully coupled out from the other end 302 of fiber 30 into an optical lens 303, preferably a gradient lens, which concentrates the coupled-out light under test L and exciting light L1. The crystal 6 is arranged between the lens 303 and the reflector 9 and is transilluminated by concentrated light under test L, while in the crystal 6 the fluorescent light L2 is produced by absorption of the exciting light L1. The lens 303 focuses the concentrated light under test L reflected by the reflector 9, and a large part of the fluorescent light L2, onto the other end 302 of the fiber 30, and couples this light L and L2 into this fiber 30.

The fluorescing material 6 can also be present in the form of a fluorescing optical fiber doped with a doping material that produces the fluorescence, for example erbium. Fibers doped wits erbium are already used as optical amplifiers. The fluorescing fiber can be a segment of the fiber of a coil. In the exemplary sensor 1, the fluorescing fiber 6 is usefully an end segment $30_2$, containing the other end 302, of the fiber 30 of the coil 3. In this case as well, it is useful if the optical lens 303 is arranged between the other end 302 of the fiber 30 and the reflector 9, which optical lens 303 concentrates the light under test L coupled out from the other end 302 of the fiber 30 and the fluorescent light L2, and focuses the concentrated light under test L reflected by the reflector 9 and the fluorescent light L2 again onto the other end 302 of the fiber 30, and couples it into this fiber 30.

The invention has been specified in connection with a magneto-optical sensor for the measurement of the current strength I of an electrical current i flowing in a conductor 2. Alternatively or additionally, it can be used in this sense in an electro-optical sensor for measuring the electrical voltage U, e.g., an alternating voltage, adjacent to the conductor 2. In this case, the sensor measures, in the optically transparent medium, the electrical field strength of the electrical or electromagnetic field produced by the voltage U, for example with the aid of the Pockels effect.

What is claimed is:

1. A sensor for measuring an electrical property selected from current strength and electrical voltage in an electrical conductor having electricity flowing therein, said sensor comprising a source producing a testing light having a physical parameter; an optical transparent medium being arranged to surround the electrical conductor and in an electrical magnetic field produced by electricity flowing through the electrical conductor, said medium having a Verdet constant which will change the physical parameter of the testing light with the constant depending on the temperature of the medium and on the particular field strength of the electromagnetic field, means for directing the testing light through the medium, first evaluation means for determining corresponding modifications in the physical parameter of the testing light that has passed through the medium, a fluorescing material being arranged close to the optical transparent medium to have essentially the same temperature as the temperature of the transparent medium, said fluorescing material emitting a fluorescent light when excited by irradiation of an exciting light, said fluorescent light having an intensity that decays after termination of irradiation of the exciting light with the decay time depending on the temperature of the fluorescing material, an exciting light source for production of the intensity modulated exciting light and directing it onto the fluorescing material and a fluorescent light evaluation means for determining a decay time of the fluorescent light excited by the intensity modulated exciting light and determining the temperature of the fluorescing material based on the determined decay time of the fluorescent light with the value of the Verdet constant being determined based on the determined temperature and the value of the Verdet constant being used to determine the value of the electrical property.

2. A sensor according to claim 1, wherein the physical parameter of the testing light is a linear polarization of the testing light and wherein the source of the testing light produces testing light with a set linear polarization, the first evaluation means for the testing light obtains the quantity that corresponds to the modification of the polarization of the testing light that has passed through the medium and the fluorescent light evaluation means for determining the decay time of the fluorescent light excited by the intensity modulated exciting light and for determining the temperature corresponding to this decay time determines the value changes of the Verdet constant based on the temperature, which value of the Verdet constant is used to determine the electrical property.

3. A sensor according to claim 2, wherein the fluorescing material is arranged in a light path leading from the source for the testing light through the optical transparent medium and the exciting light produced by the exciting light source is coupled into the light path of the testing light and supplied by the light path to the fluorescing material.

4. A sensor according to claim 3, wherein a reflector is arranged in the light path leading from the optical transparent medium to reflect the testing light that is passed therethrough as a back reflected light back into the optical transparent medium on the light path to the first evaluation means for the testing light and wherein the fluorescing material is arranged between the optical transparent medium and the reflector.

5. A sensor according to claim 4, wherein the fluorescent light produced by the fluorescing material is conducted through the optical transparent medium on the light path of the testing light and after passing through the optical transparent medium, is coupled out of the light path of the testing light and is coupled into the fluorescent light evaluation means.

6. Sensor according to claim 3, wherein the fluorescing material is present in the form of a crystal.

7. Sensor according to claim 3, wherein the fluorescing material is present in the form of a fluorescing optical fiber.

8. Sensor according to claim 2, wherein the optically transparent medium is a light conductor made of the solid material, comprising the Verdet constant, that surrounds the electrical conductor.

9. A sensor according to claim 1, wherein the fluorescing material is arranged in the light path of the testing light directed to the medium and wherein the exciting light produced by the exciting light source is coupled into the light path of the testing light and is supplied on this light path to the fluorescing material.

10. A sensor according to claim 9, wherein a reflector is arranged in the light path leading from the optical transparent medium to reflect the testing light as a back reflected light back through the optical transparent medium to the evaluation means for the testing light, and wherein the fluorescing material is arranged between the medium and the reflector.

11. A sensor according to claim 10, wherein the fluorescent light produced by the fluorescing material is conducted through the optical transparent medium on the light path of the testing light and after passage through the optical transparent medium is coupled out of the light path of the testing light and coupled into the fluorescent light evaluation means.

12. A sensor according to claim 11, wherein the fluorescing material is present in the form of a crystal.

13. A sensor according to claim 11, wherein the fluorescing material is present in the form of a fluorescing optical fiber.

14. A sensor according to claim 11, wherein the optical transparent medium is a light conductor made of a solid material.

15. A sensor according to claim 14, wherein the fluorescing material is arranged in a light path for the testing light passing through the light conductor and the exciting light produced by the exciting light source is coupled into the light path of the testing light being supplied to the light conductor.

16. A sensor according to claim 15, wherein the reflector is arranged at the end of the light conductor to reflect the light coupled out of the light conductor back into the light conductor and to the first evaluation means and the fluorescing material is arranged between the end of the light conductor and the reflector.

17. A sensor according to claim 16, wherein the fluorescing material is present in the form of a fluorescing optical fiber connected to the end of the light conductor.

* * * * *